(12) United States Patent
Gerstenhaber et al.

(10) Patent No.: US 8,816,773 B2
(45) Date of Patent: Aug. 26, 2014

(54) OFFSET CURRENT TRIM CIRCUIT

(71) Applicant: Analog Devices, Inc., Norwood, MA (US)

(72) Inventors: Moshe Gerstenhaber, Newton, MA (US); Rayal Johnson, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 30 days.

(21) Appl. No.: 13/645,313

(22) Filed: Oct. 4, 2012

(65) Prior Publication Data

US 2014/0097896 A1    Apr. 10, 2014

(51) Int. Cl.
*H03F 3/45* (2006.01)
(52) U.S. Cl.
USPC .......................................... 330/260; 330/252
(58) Field of Classification Search
CPC ............ H03F 3/45596; H03F 3/45744; H03F 3/45892; H03F 3/45968; H03F 2200/375; H03F 2203/45038; H03F 2203/45041; H03F 2203/45042; H03F 2203/45044; H03F 2203/45152; H03F 2203/45212; H03F 2203/45214
USPC ................................. 330/252–261
See application file for complete search history.

(56) References Cited

U.S. PATENT DOCUMENTS

| | | | |
|---|---|---|---|
| 6,696,894 B1 | 2/2004 | Huang | |
| 7,049,889 B2 | 5/2006 | Kalb | |
| 7,109,697 B1 | 9/2006 | Atrash et al. | |
| 7,193,467 B2 * | 3/2007 | Garlepp et al. | 330/259 |

OTHER PUBLICATIONS

Analog Devices, "AD628 Data Sheet," Apr. 2007, 20 pages. Available at: http://www.analog.com/static/imported-files/data_sheets/AD628.pdf (accessed on Apr. 4, 2013).
Analog Devices, "AD629 Data Sheet," Apr. 2011, 16 pages. Available at: http://www.analog.com/static/imported-files/data_sheets/AD629.pdf (accessed on Apr. 4, 2013).
Analog Devices, "AD8221 Data Sheet," Mar. 2011, 24 pages. Available at: http://www.analog.com/static/imported-files/data_sheets/AD8221.pdf (accessed on Apr. 4, 2013).
U.S. Appl. No. 13/625,604, filed Sep. 24, 2012.

* cited by examiner

*Primary Examiner* — Hieu Nguyen
(74) *Attorney, Agent, or Firm* — Knobbe, Martens, Olson & Bear LLP

(57) ABSTRACT

Apparatus and methods are disclosed related to trimming an input offset current of an amplifier. One such apparatus can include auxiliary bipolar transistors connected in parallel with bases of respective bipolar transistors of an input stage of an amplifier. The auxiliary bipolar transistors can be biased such that the base currents of the auxiliary bipolar transistors compensate for a mismatch in base currents of the bipolar transistors of the input stage of an amplifier. The offset current at an input of an amplifier can be reduced independent of an offset voltage at the input of the amplifier.

26 Claims, 2 Drawing Sheets

OFFSET CURRENT TRIM CIRCUIT

TECHNICAL FIELD

The disclosed technology relates to electronic systems, and more particularly, to circuits configured to reduce an offset current.

DESCRIPTION OF THE RELATED TECHNOLOGY

Electronic systems can include amplifiers, such as a difference amplifier, that are configured to compare two or more signals. Variations, such as process variations, can result in an offset voltage and/or an offset current in the input stage of the amplifier. These offsets can determine the precision of the amplifier, or alternatively the minimum signal the amplifier is able to measure.

It can be advantageous to trim the offset voltage and the offset current of the amplifier such that these offsets are close to zero. Offset voltages can been reduced by a variety of circuits. Even if the offset voltage is trimmed close to zero, there can still be an offset current present in certain applications. However, conventional circuits have encountered difficulties in trimming the offset voltage and the offset current independently. Accordingly, a need exists for reducing offset currents.

SUMMARY OF CERTAIN INVENTIVE ASPECTS

One aspect of this disclosure is an apparatus that includes an offset current trim circuit. The offset current trim circuit includes a first bipolar transistor, a second bipolar transistor, a first auxiliary bipolar transistor having a base electrically connected in parallel with a base of the first bipolar transistor, and a second auxiliary bipolar transistor having a base electrically connected in parallel with a base of the second bipolar transistor. The offset current trim circuit also includes a first auxiliary current source configured to bias the first auxiliary bipolar transistor and a second auxiliary current source configured to bias the second auxiliary bipolar transistor. The first auxiliary current source and the second auxiliary current source are configured to bias the first auxiliary bipolar transistor and the second auxiliary bipolar transistor, respectively, to compensate for a mismatch between current at the base of the first bipolar transistor and current at the base of the second bipolar transistor.

Another aspect of this disclosure is an apparatus that includes first bipolar transistor, a second bipolar transistor, a third bipolar transistor, and a fourth bipolar transistor. The first bipolar transistor has a first collector, a first base configured to receive a first input signal, and a first emitter. The first bipolar transistor has a first base current. The second bipolar transistor has a second collector, a second base configured to receive a second input signal, and a second emitter. The second bipolar transistor has a second base current. The third bipolar transistor has a third collector, a third base electrically connected in parallel with the first base, and a third emitter. The third bipolar transistor has a third base current. The fourth bipolar transistor has a fourth collector, a fourth base electrically connected in parallel with the second base, and a fourth emitter. The fourth bipolar transistor has a fourth base current. The first bipolar transistor, the second bipolar transistor, the third bipolar transistor, and the fourth bipolar transistor are configured such that a first difference between the third base current and the fourth base current compensates for a second difference between the first base current and the second base current.

Yet another aspect of this disclosure is a method of trimming offset current. The method includes first measuring the offset voltage between the base of the first transistor and the base of the second transistor and trimming this offset preferably to zero. Any residual offset should then be due to an offset current. The first bipolar transistor and the second bipolar transistor are included in an input stage of an amplifier. In addition, the method includes, independent of an offset voltage between the base of the first transistor and the base of the second transistor, compensating for a mismatch between base current of the first bipolar transistor and base current of the second bipolar transistor.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Figure 1:
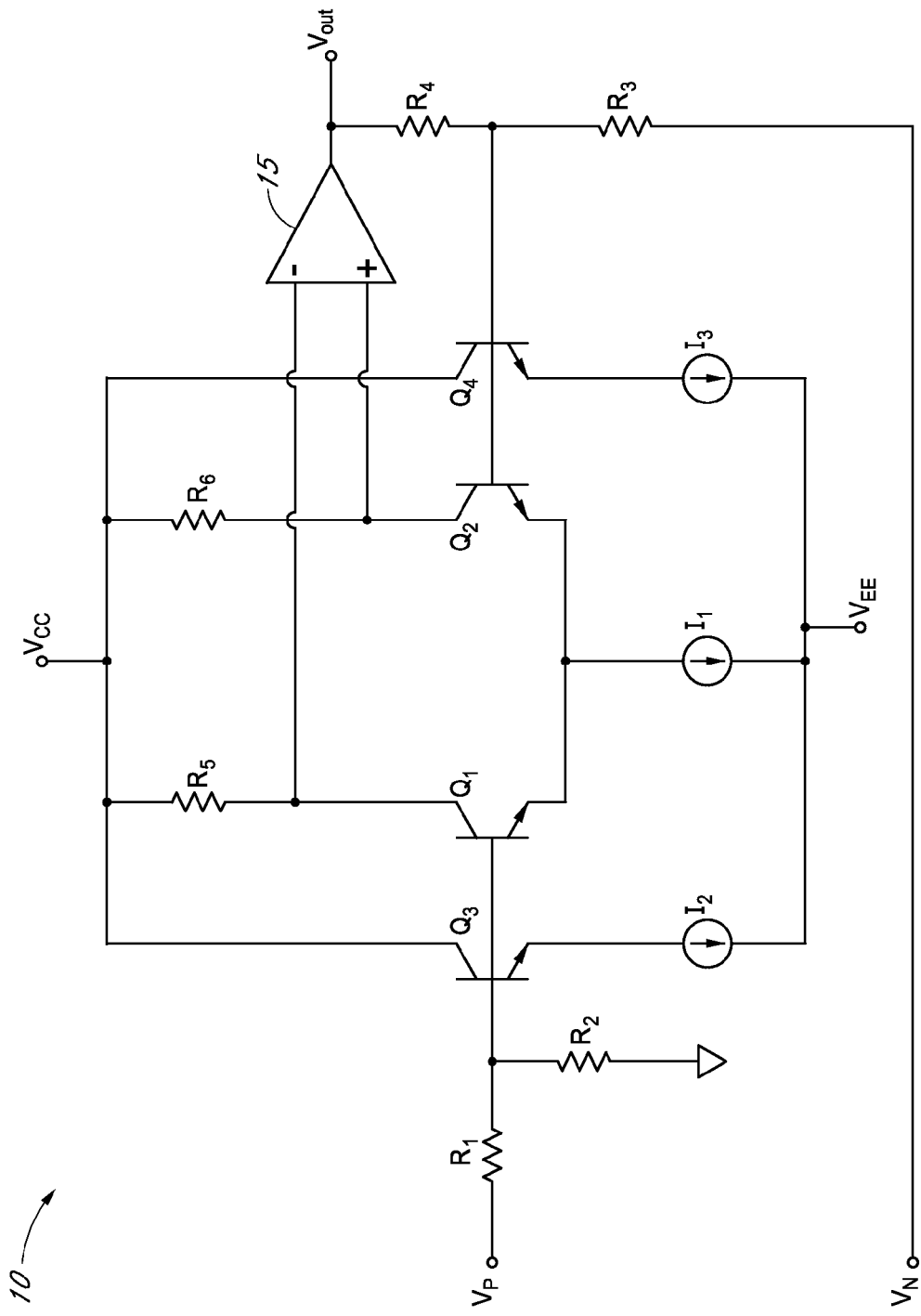
FIG. 1 is a schematic diagram illustrating an amplifier including an offset trim circuit, according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals indicate identical or functionally similar elements.

As discussed above, an electronic system can include an amplifier. Some amplifiers, such as a high common-mode voltage difference amplifier, can have high input impedance, for example, approximately 1 megaohm (MΩ). In certain implementations, a 1 nanoampere (nA) offset current at an input can result in approximately a 1 millivolt (mV) offset voltage at the output of such an amplifier. Additionally, in some of these implementations, the amplifier can have a relatively large noise gain, for example, 60. This can result in, for example, a 0.9 mV offset at the output of the amplifier due to a 15 microvolt (uV) offset voltage at the input. To reduce offset voltage, circuits can trim offset voltages independent of temperature, trim offset voltages independent of a trim in offset drift, the like, or any combination thereof. Even when the offset voltage is trimmed close to zero, currents in input transistors can be different. For instance, differences in base currents of bipolar input transistors can result in an offset current. When a difference amplifier has low input impedance and/or a low noise gain, trimming offset voltage without trimming offset current may be sufficient. However, when a difference amplifier has large input impedance and a large noise gain, the magnitude of errors due to an offset voltage and an offset current can be on the same order of magnitude.

It can be advantageous to trim such an offset current independent of offset voltage in such amplifiers.

Generally described, aspects of this disclosure relate to trimming offset current. According to one or more features described herein, offset current at an input of an amplifier can be reduced independent of an offset voltage at the input of the amplifier. Auxiliary bipolar transistors can be connected in parallel with bases of input bipolar transistors of an input stage of an amplifier, which can be, for example, a differential pair. The auxiliary bipolar transistors can be biased such that the base currents of the auxiliary bipolar transistors compensate for a mismatch in base currents of the bipolar input transistors of the input stage of the amplifier. The magnitude of collector current bias for the auxiliary bipolar transistors can be determined by the range of offset current trim desired. For instance, when the base current of one input transistor of a differential pair is greater than the base current of the other bipolar input transistor of the differential pair in the input stage of the amplifier, the base currents of the auxiliary bipolar transistors can be trimmed such that the combined base currents of the input bipolar transistors and the auxiliary transistors with bases coupled in parallel with respective transistors of the input stage of the amplifier are approximately equal. The collector currents of the auxiliary bipolar transistors can be outside of signal paths between inputs of the amplifier and the amplifier output. As a result, the auxiliary bipolar transistors do not meaningfully contribute to the voltage noise of the amplifier. Similar transistors can be used for the input bipolar transistors and the auxiliary bipolar transistors. Consequently, offset current trim may not be affected by process type.

When an offset voltage multiplied by the noise gain is comparable to the offset current multiplied by the input impedance and either error is larger than the minimum desirable error, then trimming of the offset voltage and the offset current independently can be desirable. The principles and advantages described herein can be implemented in any such applications. For instance, in certain embodiments, the principles and advantages described herein can be implemented in an amplifier with a large noise gain (for example, 50 or greater) that is driven with a large source impedance (for example, 1 MΩ or greater). It will be understood that the effects of the offset voltage and offset current to the amplifier output typically depend on the range of gains and the magnitude of the source impedance.

With reference to FIG. 1, an illustrative amplifier 10 including an offset trim circuit will be described. Although the illustrated amplifier 10 is a difference amplifier, it will be understood that the principles and advantages described herein can be applied to any suitable amplifier with an offset current that is significant. The amplifier 10 can include a differential pair of input bipolar transistors, an offset trim circuit, a plurality of resistors, a plurality of current sources, and an amplification circuit 15. While the illustrated differential pair and offset trim circuit include NPN transistors, it will be understood that any combination of features described with reference to NPN transistors can alternatively or additionally be implemented with PNP transistors and the corresponding reversing of current directions and the swapping of positive voltage for negative voltage and vice versa. Although some embodiments may relate to a differential pair of transistors, it will be understood that any combination of features can be implemented in connection with any suitable pair of transistors having a mismatch in base current that it would be advantageous to reduce. For instance, the mismatch in base current can be reduced in an input stage of an amplifier according to one or more features described herein. The amplifier 10 can receive a first input voltage $V_P$ and a second first input voltage $V_N$. Based on the received voltages, the amplifier 10 can generate an output voltage $V_{OUT}$.

The noise gain of the illustrated amplifier 10 can be set by the impedances of the third resistor R3 and the fourth resistor R4. As one example, the impedance of the first resistor R1 and the third resistor R3 can be approximately 1 MΩ and the impedance of the second resistor R2 and the fourth resistor can be approximately 20 kΩ. These impedances can result in a noise gain of a little more than 1 for the amplifier. As another example, when the first through fourth resistors R1-R4 each have an impedance of about 1 MΩ, then the noise gain would be 2. With a noise gain of 2, an offset between the bases of the first and third transistors Q1 and Q3, respectively, and the bases of the second and fourth transistors Q2 and Q4, respectively, of 15 uV can result in a 30 uV offset on the output voltage $V_{OUT}$. In this example, a 1 nA offset current can generate a 1 mV offset on the output voltage $V_{OUT}$, illustrating that offset current can have a greater effect than offset voltage on the output voltage $V_{OUT}$. An offset voltage between the bases of the first and third transistors Q1 and Q3, respectively, and the bases of the second and fourth transistors Q2 and Q4, respectively, can be undesirable in a number of applications. The offset voltages can be reduced by any suitable method. However, as discussed above, offset currents may still be present when only trimming input voltage offsets.

When the impedance of the first resistor R1 and the third resistor R3 is about 1 MΩ or greater, the amplifier 10 can be referred to as a high input impedance amplifier. In a high input impedance amplifier with a relatively low noise gain, offset current can dominate offset voltage. Similarly, in a lower input impedance amplifier with a relatively high noise gain (for example, about 50 or greater), offset voltage can dominate offset current. When offset voltage dominates offset current, suitable performance can be achieved by trimming offset voltage without trimming offset current. However, in a high input impedance amplifier with a high noise gain, the effect of the offset voltage and the offset current at the output of the amplifier can be on the same order. Consequently, it can be desirable to trim offset current in such implementations.

An input stage of the amplifier 10 can include a first bipolar transistor Q1 and a second bipolar transistor Q2. Thus, the first bipolar transistor Q1 and the second bipolar transistor Q2 can be referred to as input bipolar transistors. As shown in FIG. 1, the first bipolar transistor Q1 and the second bipolar transistor Q2 can be a differential pair. The first bipolar transistor Q1 and the second bipolar transistor Q2 can be matched.

The first bipolar transistor Q1 can have a collector, a base, and an emitter. The collector of the first bipolar transistor Q1 can be electrically connected to a negative input node of the amplification circuit 15. The collector of the first bipolar transistor Q1 can be also be electrically connected to a first end of a fifth resistor R5. A second end of the fifth resistor R5 can be electrically connected to a power supply voltage, such as $V_{CC}$. The base of the first bipolar transistor Q1 can receive the first input voltage $V_P$ via the first resistor R1. The first resistor R1 can have a first end coupled to the first input voltage $V_P$ and second end coupled to the base of the first bipolar transistor Q1 The first resistor R1 can have a high impedance. The base of the first bipolar transistor Q1 can also be coupled to a first end of the second resistor R2. A second end of the second resistor R2 can be coupled to a voltage reference, such as ground. The emitter of the first bipolar transistor Q1 can be electrically connected to the first current source I1.

The second bipolar transistor Q2 can have a collector, a base, and an emitter. The collector of the second bipolar transistor Q2 can be electrically connected to a positive input node of the amplification circuit 15. The collector of the second bipolar transistor Q2 can be also be electrically connected to a first end of a sixth resistor R6. A second end of the sixth resistor R6 can be electrically connected to a power supply voltage, such as $V_{CC}$. The sixth resistor R6 can have an impedance that is approximately the same as an impedance of the fifth resistor R5. The base of the second bipolar transistor Q2 can receive the second input voltage $V_N$ via the third resistor R3. The third resistor R3 can have a high impedance. In some implementations, the impedance of the third resistor R3 can be approximately equal to the impedance of the first resistor R1. The third resistor R3 can have a first end coupled to the second input voltage $V_N$ and a second end coupled to the base of the second bipolar transistor Q2. The base of the second bipolar transistor Q2 can also be coupled to a first end of the fourth resistor R4. A second end of the fourth resistor R4 can be coupled to an output of the amplification circuit 15. In some implementations, the fourth resistor R4 can have an impedance that is approximately equal to the impedance of the second resistor R2. The emitter of the second bipolar transistor Q2 can be electrically connected to the first current source I1. When the first bipolar transistor Q1 matches the second bipolar transistor Q2, the fifth resistor R5 matches the sixth resistor R6 and the amplification circuit 15 has a relatively high gain, half of the current from the first current source I1 can flow through each of these transistors when amplifier 10 is connected in feedback. According to certain embodiments, the emitter of the second bipolar transistor can also be electrically connected to the emitter of the first bipolar transistor Q1.

An input offset current of the amplifier 10 can result from a mismatch in the base current of the first bipolar transistor Q1 and the base current at the second bipolar transistor Q2. Such a mismatch can result from, for example, process variations in the manufacture of the first bipolar transistor Q1 and the second bipolar transistor Q2. When the base current of the first bipolar transistor Q1 is greater than the base current of the second bipolar transistor Q2, the input offset current can result in an offset voltage on the output voltage $V_{OUT}$ with a value approximately equal to the input offset current times the impedance of the second resistor R2. For instance, when the input offset current is 1 nA and the second resistor R2 has an impedance of 1 MΩ, this can cause an offset voltage on the output voltage $V_{OUT}$ of 1 mV, which can be significant. To reduce this offset voltage on $V_{OUT}$, the mismatch in the base current of the first bipolar transistor Q1 and the base current of the second bipolar transistor can be reduced. Ideally, the mismatch in base current of the first bipolar transistor Q1 and the base current of the second bipolar transistor would be zero. At the same time, it can be desirable to have substantially the same base to emitter voltage in the first bipolar transistor Q1 and the second bipolar transistor Q2. Thus, in some embodiments, the emitters of the first bipolar transistor Q1 and the second bipolar transistor Q2 can be electrically connected, for example, directly electrically connected.

The collector of the first bipolar transistor Q1 and the collector of the second bipolar transistor Q2 can drive an amplification circuit 15. An amplification circuit can be any suitable circuit configured to amplify input signal(s). For instance, as illustrated in FIG. 1, the amplification circuit 15 can be an operational amplifier having inverting (negative) and non-inverting (positive) input nodes.

The offset trim circuit can include a third bipolar transistor Q3, a fourth bipolar transistor Q4, a second current source I2, and a third current source I3. The third bipolar transistor Q3 and the fourth bipolar transistor Q4 can be referred to as auxiliary bipolar transistors. The currents in the auxiliary transistors can be suitably sized to compensate for a mismatch in base current of the transistors in the differential pair. Implementing the auxiliary transistors Q3, Q4 such that they have a similar current gain to each other can facilitate trimming offset current independently of process type. The collectors of the auxiliary transistors can be outside of the signal paths from the first input voltage $V_P$ and the second input voltage $V_N$ to inputs to the amplification circuit 15. Consequently, the second current source I2 and the third current source I3 do not contribute to an input offset voltage of the amplifier 10. For instance, the second current source I2 and the third current source I3 do not cause a difference between the base-to-emitter voltages of the first bipolar transistor Q1 and the second bipolar transistor Q2.

The third bipolar transistor Q3 can have a collector, a base, and an emitter. The third bipolar transistor Q3 can be similar to the first bipolar transistor Q1 such that these transistors have similar characteristics. The collector of the third bipolar transistor Q3 can be electrically connected to a power supply voltage, such as $V_{CC}$. The base of the third bipolar transistor Q3 can be electrically connected in parallel with the base of the first bipolar transistor Q1. The base of the third bipolar transistor Q3 can receive the first input voltage $V_P$ via the first resistor R1. As discussed above, the first resistor R1 can have a high impedance. The base of the third bipolar transistor Q3 can also be coupled to the first end of the second resistor R2. The emitter of the third bipolar transistor Q3 can be electrically connected to the second current source I2.

The second current source I2 can provide a bias current to the emitter of the third bipolar transistor Q3. The second current source I2 can be any suitable current source. In one embodiment, the second current source I2 is a degenerated transistor current source, and the current provided by the second current source I2 can be adjusted during manufacturing by laser trimming the degeneration resistor.

The fourth bipolar transistor Q4 can have a collector, a base, and an emitter. The fourth bipolar transistor Q4 can be similar to the second bipolar transistor Q2 such that these transistors have similar characteristics. The collector of the fourth bipolar transistor Q4 can be electrically connected to a power supply voltage, such as $V_{CC}$. The base of the fourth bipolar transistor Q4 can be electrically connected in parallel with the base of the second bipolar transistor Q2. The base of the fourth bipolar transistor Q4 can receive the second input voltage $V_N$ via the third resistor R3. As discussed above, the third resistor R3 can have a high impedance. The base of the fourth bipolar transistor Q4 can also be coupled to the fourth resistor R4. The emitter of the fourth bipolar transistor Q4 can be electrically connected to the third current source I3.

The third current source I3 can provide a bias current to the emitter of the fourth bipolar transistor Q4. The third current source I3 can be manufactured to provide approximately the same amount of current as the second current source I2, in the absence of laser trimming. The third current source I3 can be any suitable current source that matches the second current source I2. In one embodiment, the current provided by the third current source I3 can be adjusted during manufacturing by laser trimming a resistor in the third current source I3.

The third bipolar transistor Q3 and the fourth bipolar transistor Q4 can be biased by the current sources I2, I3 such that their base current mismatch compensates for the input offset current that can result from mismatches between the base currents of the first bipolar transistor Q1 and the second bipolar transistor Q2. To get approximately zero overall offset current the, base currents in the input stage of the amplifier 10 and the auxiliary transistors Q3, Q4 can be represented by Equation 1:

$$I_{BQ1}+I_{BQ3}=I_{BQ2}+I_{BQ4} \quad \text{(Equation 1)}$$

In Equation 1, $I_{BQ1}$ can represent the base current of the first bipolar transistor Q1, $I_{BQ2}$ can represent the base current of the second bipolar transistor Q2, $I_{BQ3}$ can represent the base current of the third bipolar transistor Q3, and $I_{BQ4}$ can represent the base current of the fourth bipolar transistor Q4. As shown in Equation 1, the base currents of the auxiliary transistors can compensate for a mismatch in base currents of the first bipolar transistor Q1 and the second bipolar transistor Q2. Balancing the base currents in accordance with Equation 1 can compensate for an input offset current in the amplifier 10.

The mismatch in base currents between the first bipolar transistor Q1 and the second bipolar transistor Q2 can be observed during production. To reduce this mismatch, a resistor in the second current source I2 and/or a resistor in the third current source I3 can be laser trimmed. This can compensate for the mismatch in base currents of the first bipolar transistor Q1 and the second bipolar transistor Q2 to make the overall offset current approximately zero. For instance, when the base current of the first bipolar transistor Q1 is greater than the base current of the second bipolar transistor Q2, a resistor in the second current source I2 can be trimmed to decrease the current provided to the emitter of the third bipolar transistor Q3. As another example, when the base current of the first bipolar transistor Q1 is less than the base current of the second bipolar transistor Q2, a resistor in the third current source I3 can be trimmed to decrease the current provided to the emitter of the fourth bipolar transistor Q4. Aside from laser trimmed resistor(s), in one embodiment, the second current source I2 and the third current source I3 can be substantially the same. In the embodiment illustrated in FIG. 1, the second current source I2 and the third current source I3 can each provide a current sufficiently large to compensate for the full range of offset current between the first transistor Q1 and the second transistor Q2.

Figure 2:
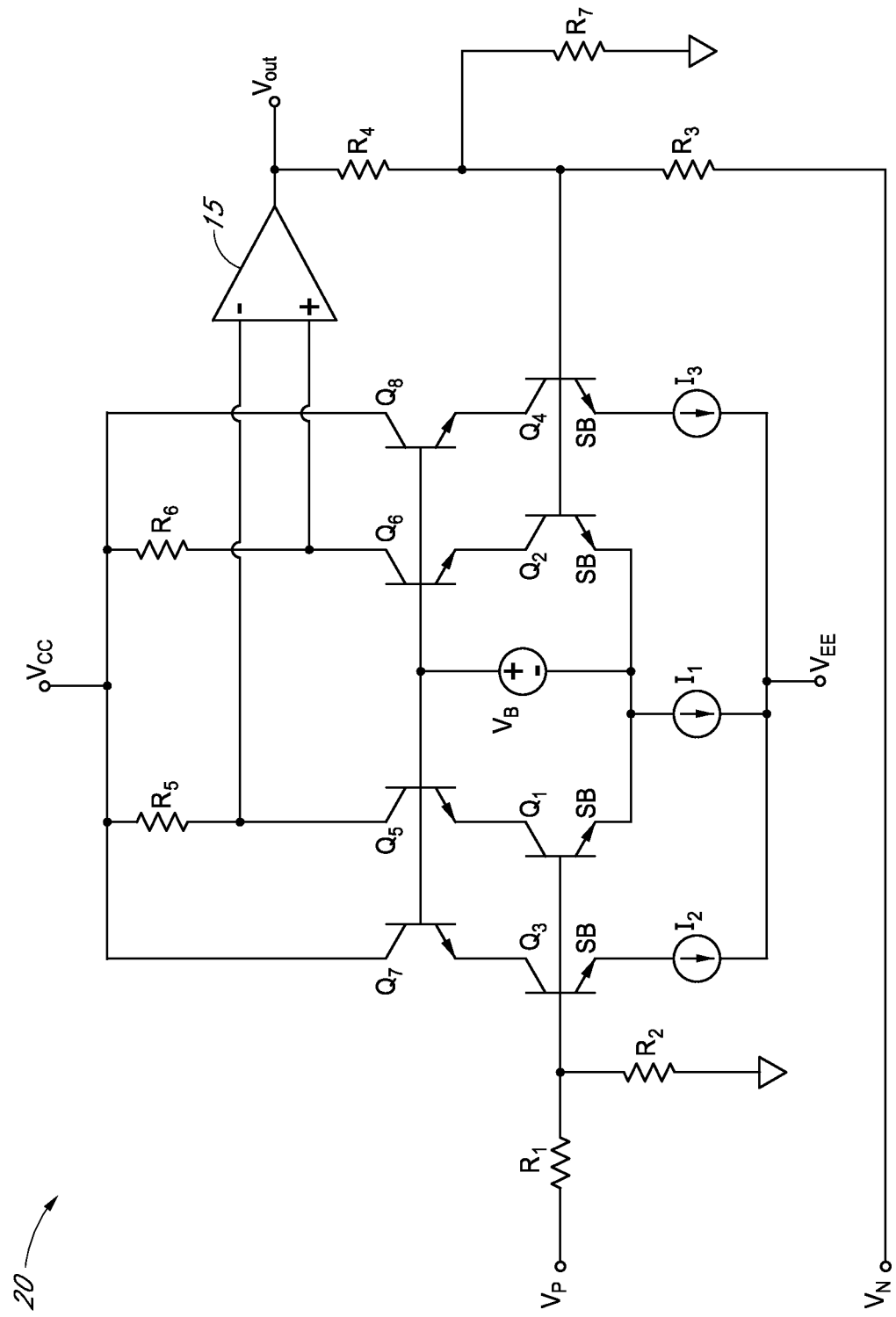
FIG. 2 is a schematic diagram illustrating an amplifier including an offset trim circuit, according to another embodiment.

With reference to FIG. 2, another illustrative amplifier 20 including an offset trim circuit will be described. The amplifier 20 of FIG. 2 can be substantially the same as the amplifier 10 of FIG. 1, except that such an amplifier can alternatively or additionally include one or more features discussed below.

As shown in FIG. 2, the first bipolar transistor Q1, the second bipolar transistor Q2, the third bipolar transistor Q3, and the fourth bipolar transistor Q4 can each be super-beta transistors as denoted by "SB" next to corresponding transistors. A super-beta transistor can have a β on the order of 5,000 to 10,000. In bipolar amplifiers with super-beta input stages, base current can be relatively low. While the base current can depend on the order of the currents that bias a super-beta bipolar transistor, in certain implementations, base current of a super-beta transistor can be on the order of a few tens of pico Amperes (pA). With super-beta transistors, there can be less mismatch between base currents of the first bipolar transistor Q1 and the second bipolar transistor Q2 compared to bipolar amplifiers without super-beta transistors. As a result, the offset current can be about an order of magnitude less.

The amplifier 20 can also include fifth to eight bipolar transistors Q5-Q8. As illustrated, the amplifed 20 can include a cascode topology driving the positive input node and the negative input node of the amplification circuit 15. More specifically, the first bipolar transistor Q1 and the fifth bipolar transistor Q5 can be referred to as a cascode. Similarly, the second bipolar transistor Q2 and the sixth bipolar transistor Q6 can also be referred to as a cascode. The auxiliary transistors Q3, Q4 can also be included in a cascode for purposes of matching. The first bipolar transistor Q1 can be electrically connected to a negative terminal of the amplification circuit 15 via the fifth bipolar transistor Q5. The collector of the first bipolar transistor Q1 can be coupled to the emitter of the fifth bipolar transistor Q5. The collector of the fifth bipolar transistor Q5 can be coupled to the negative terminal of the amplification circuit 15. The base of the fifth bipolar transistor Q5 can be coupled to a positive terminal of the voltage source $V_B$. The negative terminal of the voltage source $V_B$ can be coupled to the emitter of the first bipolar transistor Q1.

The second bipolar transistor Q2 can be electrically connected to a positive terminal of the amplification circuit 15 via the sixth bipolar transistor Q6. The collector of the second bipolar transistor Q2 can be coupled to the emitter of the sixth bipolar transistor Q6. The collector of the sixth bipolar transistor Q6 can be coupled to the positive terminal of the amplification circuit 15. The base of the sixth bipolar transistor Q6 can be coupled to a positive terminal of the voltage source $V_B$ and/or the base of the fifth bipolar transistor Q5. The negative terminal of the voltage source $V_B$ can be coupled to the emitter of the second bipolar transistor Q2.

The seventh bipolar transistor Q7 can have a collector, a base, and an emitter. The collector of the seventh bipolar transistor Q7 can be electrically connected to a power supply, such as $V_{CC}$. The base of the seventh bipolar transistor Q7 can be electrically connected in parallel with the base of the fifth bipolar transistor Q5. The emitter of the seventh bipolar transistor Q7 can be electrically connected to the collector of the third bipolar transistor Q3.

The eighth bipolar transistor Q8 can have a collector, a base, and an emitter. The collector of the eighth bipolar transistor Q8 can be electrically connected to a power supply, such as $V_{CC}$. The base of the eighth bipolar transistor Q8 can be electrically connected in parallel with the base of the sixth bipolar transistor Q6. The emitter of the eighth bipolar transistor Q8 can be electrically connected to the collector of the fourth bipolar transistor Q4.

As illustrated in FIG. 2, the amplifier 20 can include a seventh resistor R7 having a first end electrically connected to a ground potential and a second end electrically connected to the second end of the third resistor R3 and the first end of the fourth resistor R4. The impedance of the fourth resistor R4 and the impedance of the seventh resistor R7 can together set a gain of the amplifier 20. The seventh resistor R7 can provide a path to a reference potential, such as ground.

One or more features of the amplifier 10 and/or the amplifier 20 can be implemented to perform a method of offset current compensation. For instance, one such method can include measuring and trimming an offset voltage between the base of the first transistor Q1 and the base of the second transistor Q2 to approximately zero, and subsequently trimming the second and/or third current sources I2 and I3, respectively, until the output of the amplifier 10 has an offset current of substantially zero. The first bipolar transistor and the second bipolar transistor can be included in an input stage of an amplifier. For instance, the first bipolar transistor and the second bipolar transistor can be a differential pair. A mismatch between base current of the first bipolar transistor and base current of the second bipolar transistor can be compensated for independent of an offset voltage between the input of the amplifier, such as difference between the base voltages of the first and second transistor Q1 and Q2.

Compensating for the mismatch between the base current of the first and second bipolar transistors can be independent of process type. Alternatively or additionally, compensating for the mismatch between base current of the first and second bipolar transistors can include biasing a third bipolar transistor having a base electrically connected to the base of the first bipolar transistor with a first auxiliary current, and biasing a fourth bipolar transistor having a base electrically connected to the base of the second bipolar transistor with a second auxiliary current. For instance, the third bipolar transistor can be biased by the second current source I2 and the fourth bipolar transistor can be biased by the third current source I3. In one example, the mismatch in current between the base current of the first bipolar transistor and the base current of the second bipolar transistor can have a magnitude approximately equal to a magnitude of a difference between the base current of the third bipolar transistor that is based at least in part on the second current and the base current of the fourth bipolar transistor that is based at least in part on the third current. In some of these implementations, the collector current of the third bipolar transistor is outside of a first signal path from the first input voltage to a first input of an amplification circuit driven at least in part by a collector of the first bipolar transistor, and the collector current of the fourth bipolar transistor is outside of a second signal path from the second input voltage to a second input of the amplification circuit driven at least in part by a collector of the second bipolar transistor.

The apparatus and methods described herein can be applied to any circuit in which the offset current multiplied by input impedance results in an offset voltage that is larger than desired. For example, in some embodiments, the apparatus and methods described herein can be applied to a high input impedance amplifier, such as the example amplifier in which the base of the first bipolar transistor is driven via circuit element(s) having an impedance of about 1 MΩ and the base of the second bipolar transistor is driven via circuit element(s) having an impedance of about 1 MΩ.

In the embodiments described above, apparatus and methods with offset trim circuits were described in connection with particular embodiments. It will be understood, however, that the principles and advantages of the embodiments can be used for any other systems, apparatus, or methods with a need for compensating for a mismatch in base currents of a pair of bipolar transistors. For instance, although the embodiments illustrated in FIGS. 1 and 2 are difference amplifiers, one or more features described herein can be implemented in a variety of other amplifiers, such as instrumentation amplifiers or any other suitable bipolar amplifier having an offset current in an input. As another example, any circuit where an offset current causes an error can implement one or more features described herein to compensate for the offset current. As another example, one or more features related to compensating for an offset current can be implemented in combination with a circuit configured to trim an offset voltage. Moreover, the bipolar transistors discussed herein can be formed by any suitable process, such as a Si process, a BiCMOS process, a GaAs process, or the like.

Such methods, systems, and/or apparatus can be implemented into various electronic devices. Examples of the electronic devices can include, but are not limited to, consumer electronic products, parts of the consumer electronic products, electronic test equipment, etc. Examples of parts of consumer electronic products can include amplifiers, rectifiers, programmable filters, attenuators, variable frequency circuits, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An apparatus comprising:
a first bipolar transistor;
a second bipolar transistor;

a first auxiliary bipolar transistor having a base electrically connected in parallel with a base of the first bipolar transistor;
a first auxiliary current source configured to bias the first auxiliary bipolar transistor;
a second auxiliary bipolar transistor having a base electrically connected in parallel with a base of the second bipolar transistor;
a second auxiliary current source configured to bias the second auxiliary bipolar transistor, wherein the first auxiliary current source and the second auxiliary current source are configured to bias the first auxiliary bipolar transistor and the second auxiliary bipolar transistor to compensate for a mismatch between current at the base of the first bipolar transistor and current at the base of the second bipolar transistor; and
an other current source configured to bias at least one of the first bipolar transistor or the second bipolar transistor.

2. The apparatus of claim 1, wherein the first auxiliary current source and the second auxiliary current source are configured to compensate for the mismatch independent of process type.

3. The apparatus of claim 1, wherein the first bipolar transistor and the second bipolar transistor are a differential pair.

4. The apparatus of claim 1, further comprising an amplification circuit having a first input driven by a collector of the first bipolar transistor and a second input driven by a collector of the second bipolar transistor.

5. The apparatus of claim 4, wherein the first auxiliary current source is not included in a signal path between a signal received at the base of the first bipolar transistor and the first input of the amplification circuit.

6. The apparatus of claim 1, wherein the first auxiliary current source comprises a resistor having a different resistance than a corresponding resistor included in the second auxiliary current source such that a first difference between current at the base of the first bipolar transistor and current at the base of the second bipolar transistor substantially equals a second difference between current at the base of the second auxiliary bipolar transistor and current at the base of the first auxiliary bipolar transistor.

7. The apparatus of claim 1, wherein the first bipolar transistor, the second bipolar transistor, the first auxiliary transistor, and the second auxiliary transistor are super-beta bipolar transistors.

8. The apparatus of claim 1, wherein the other current source is configured to bias both the first bipolar transistor and the second bipolar transistor.

9. An apparatus comprising:
a first bipolar transistor having a first collector, a first base configured to receive a first input signal, and a first emitter, the first bipolar transistor having a first base current;
a second bipolar transistor having a second collector, a second base configured to receive a second input signal, and a second emitter, the second bipolar transistor having a second base current;
a third bipolar transistor having a third collector, a third base electrically connected in parallel with the first base, and a third emitter, the third bipolar transistor having a third base current; and
a fourth bipolar transistor having a fourth collector, a fourth base electrically connected in parallel with the second base, and a fourth emitter, the fourth bipolar transistor having a fourth base current;
wherein the first bipolar transistor, the second bipolar transistor, the third bipolar transistor, and the fourth bipolar transistor are configured such that a first difference between the third base current and the fourth base current compensates for a second difference between the first base current and the second base current; and
wherein the first bipolar transistor is configured to receive a first bias from a first current source, the third bipolar transistor is configured to receive a second bias from a second current source, and the fourth bipolar transistor is configured to receive a third bias from a third current source.

10. The apparatus of claim 9, wherein a magnitude of the first difference substantially equals a magnitude of the second difference.

11. The apparatus of claim 9, wherein the first bipolar transistor, the second bipolar transistor, the third bipolar transistor, and the fourth bipolar transistor are configured to reduce a difference in current provided to a first input node of an amplification circuit and a second input node of the amplification circuit independent of a difference in voltage between the first input node and the second input node.

12. The apparatus of claim 9, further comprising a first input resistor having a first end coupled to the first input signal and a second end coupled to the base of the first bipolar transistor, the first input resistor having a resistance of at least about 0.5 MΩ.

13. The apparatus of claim 12, wherein a noise gain from the first input signal to an output of the amplification circuit is at least about 50.

14. The apparatus of claim 9,
wherein the first current source is configured to provide the first bias to the first emitter and the second emitter;
wherein the second current source is configured to provide the second bias to the third emitter; and
wherein the third current source is configured to provide the third bias to the fourth emitter, the third bias being different than the second bias.

15. The apparatus of claim 14, wherein the second current source comprises a trimmed resistor having a different value than a corresponding resistor in the third current source.

16. The apparatus of claim 9, further comprising:
a fifth bipolar transistor having a fifth collector electrically connected to a first input node of an amplification circuit, a fifth base, and a fifth emitter electrically connected to the first collector, such that a first cascode comprising the first bipolar transistor and the fifth bipolar transistor drives the first input node of the amplification circuit;
a sixth bipolar transistor having a sixth collector electrically connected to the second input node of the amplification circuit, a sixth base, and a sixth emitter electrically connected to the second collector, such that a second cascode comprising the second bipolar transistor and the sixth bipolar drives a second input node of an amplification circuit;
a seventh bipolar transistor having a seventh collector, a seventh base electrically connected to the fifth base, and a seventh emitter electrically connected to the third collector; and
an eighth bipolar transistor having an eighth collector, an eighth base electrically connected to the sixth base, and an eighth emitter electrically connected to the fourth collector.

17. The apparatus of claim 16, further comprising a voltage source configured to generate a potential difference between a first end of the voltage source and a second end of the voltage source, the first end coupled to the first emitter and the second emitter, and the second end coupled to the fifth base, the sixth base, the seventh base, and the eighth base.

18. The apparatus of claim 9, wherein the first bipolar transistor, the second bipolar transistor, the third bipolar transistor, and the fourth bipolar transistor are super-beta bipolar transistors.

19. The apparatus of claim 9, further comprising an operational amplifier having a first input terminal electrically connected to the first collector and a second input terminal electrically connected to the second collector.

20. An apparatus comprising:
   a first bipolar transistor having a first collector, a first base configured to receive a first input signal, and a first emitter, the first bipolar transistor having a first base current;
   a second bipolar transistor having a second collector, a second base configured to receive a second input signal, and a second emitter, the second bipolar transistor having a second base current, wherein the first emitter is electrically connected to the second emitter;
   a third bipolar transistor having a third collector, a third base electrically connected in parallel with the first base, and a third emitter, the third bipolar transistor having a third base current; and
   a fourth bipolar transistor having a fourth collector, a fourth base electrically connected in parallel with the second base, and a fourth emitter, the fourth bipolar transistor having a fourth base current;
   wherein the first bipolar transistor, the second bipolar transistor, the third bipolar transistor, and the fourth bipolar transistor are configured such that a first difference between the third base current and the fourth base current compensates for a second difference between the first base current and the second base current.

21. A method of trimming offset current, the method comprising:
   trimming an offset voltage between a base of a first bipolar transistor and a base of a second bipolar transistor to approximately zero, the first bipolar transistor and the second bipolar transistor being included in an input stage of an amplifier, wherein the base of the first bipolar transistor is driven via a circuit element having an impedance of at least about 0.5 MΩ; and
   independently of the offset voltage, compensating for a mismatch between base current of the first bipolar transistor and base current of the second bipolar transistor.

22. The method of claim 21, wherein compensating comprises adjusting a base current of at least one of a third bipolar transistor having a base electrically connected to the base of the first bipolar or a fourth bipolar transistor having a base electrically connected to the base of the second bipolar transistor.

23. The method of claim 21, wherein compensating is independent of process type.

24. The method of claim 21, wherein compensating comprises:
   biasing a third bipolar transistor with a first auxiliary current, the third bipolar transistor having a base electrically connected to the base of the first bipolar transistor;
   biasing a fourth bipolar transistor with a second auxiliary current, the fourth bipolar transistor having a base electrically connected to the base of the second bipolar transistor; and
   adjusting a relative amount of the first auxiliary current versus the second auxiliary current such that the mismatch in current between base current of the first bipolar transistor and base current of the second bipolar transistor has a magnitude approximately equal to a magnitude of a difference between a base current of the third bipolar transistor that is based at least in part on the first auxiliary current and a base current of the fourth bipolar transistor that is based at least in part on the second auxiliary current.

25. The method of claim 24, wherein collector current of the third bipolar transistor is outside of a first signal path from the first input voltage to a first input of an amplification circuit driven at least in part by a collector of the first bipolar transistor, and wherein collector current of the fourth bipolar transistor is outside of a second signal path from the second input voltage to a second input of the amplification circuit driven at least in part by a collector of the second bipolar transistor.

26. The method of claim 25, wherein the third bipolar transistor is biased by a first transistor current source having a first degenerating resistor and the fourth bipolar transistor is biased by a second transistor current source having a second degenerating resistor, and wherein at least one of the first degenerating resistor or the second degenerating resistor is trimmed such that the mismatch between the base current of the fourth bipolar transistor and the base current of the third bipolar transistor compensates for the mismatch between the base current of the first bipolar transistor and the base current of the second bipolar transistor.

\* \* \* \* \*